(12) United States Patent
Schmitt

(10) Patent No.: US 11,150,769 B2
(45) Date of Patent: Oct. 19, 2021

(54) METHOD FOR CAPACITIVELY DETECTING CONTACT AND ACTUATION

(71) Applicant: PREH GMBH, Bad Neustadt a. d. Saale (DE)

(72) Inventor: Florian Schmitt, Stangenroth (DE)

(73) Assignee: PREH GMBH, Bad Neustadt A.D. Saale (DE)

( * ) Notice: Subject to any disclaimer, the term of this patent is extended or adjusted under 35 U.S.C. 154(b) by 0 days.

(21) Appl. No.: 16/611,748

(22) PCT Filed: Mar. 29, 2018

(86) PCT No.: PCT/EP2018/058156
§ 371 (c)(1),
(2) Date: Nov. 7, 2019

(87) PCT Pub. No.: WO2018/215122
PCT Pub. Date: Nov. 29, 2018

(65) Prior Publication Data
US 2020/0110487 A1    Apr. 9, 2020

(30) Foreign Application Priority Data

May 23, 2017    (DE) .................... 10 2017 111 253.7

(51) Int. Cl.
G06F 3/044    (2006.01)
G06F 3/041    (2006.01)
H03K 17/96    (2006.01)

(52) U.S. Cl.
CPC .......... G06F 3/044 (2013.01); G06F 3/04166 (2019.05); H03K 17/962 (2013.01);
(Continued)

(58) Field of Classification Search
CPC ... G06F 3/044; G06F 3/04166; H03K 17/962; H03K 17/98; H03K 2017/9613; H03K 2017/960725; H03K 2017/960775
See application file for complete search history.

(56) References Cited

U.S. PATENT DOCUMENTS

| 2008/0174321 A1* | 7/2008 | Kang | ................. G06F 3/0445 324/686 |
| 2008/0202251 A1* | 8/2008 | Serban | ................. H03K 17/962 73/780 |

(Continued)

FOREIGN PATENT DOCUMENTS

| DE | 102016105846 A1 | 5/2017 |
| DE | 102016108293 A1 | 11/2017 |
| WO | 2016064438 A1 | 4/2016 |

OTHER PUBLICATIONS

The International Search Report and the Written Opinion for PCT/EP2018/058156, dated May 31, 2018, EPO, Rijswijk, The Netherlands.

*Primary Examiner* — Mihir K Rayan
(74) *Attorney, Agent, or Firm* — M&B IP Analysts, LLC

(57) ABSTRACT

The embodiments disclosed herein relate to a method for the capacitive detection of at least a contact of a capacitive sensor by an operator. The method includes providing the capacitive sensor and providing an electronic evaluation system; applying a first constant electric potential to the counter electrode of the capacitive sensor; applying a second constant electric potential, which differs from the first potential, to the counter electrode of the capacitive sensor; calculating a first parameter from the first measured value and the second measured value; calculating a second parameter from the first measured value and the second measured value; and respectively comparing the first parameter and the second parameter with a predefined quantity.

10 Claims, 3 Drawing Sheets

(52) U.S. Cl.
CPC .............. *H03K 2017/9613* (2013.01); *H03K 2217/960725* (2013.01)

(56) References Cited

U.S. PATENT DOCUMENTS

| | | | |
|---|---|---|---|
| 2010/0230181 A1* | 9/2010 | Suzuki ................. | H03K 17/975 178/18.06 |
| 2011/0012862 A1* | 1/2011 | Huang .................. | G06F 3/0446 345/174 |
| 2016/0087629 A1* | 3/2016 | Nishiyama ........... | H03K 17/975 200/17 R |

* cited by examiner

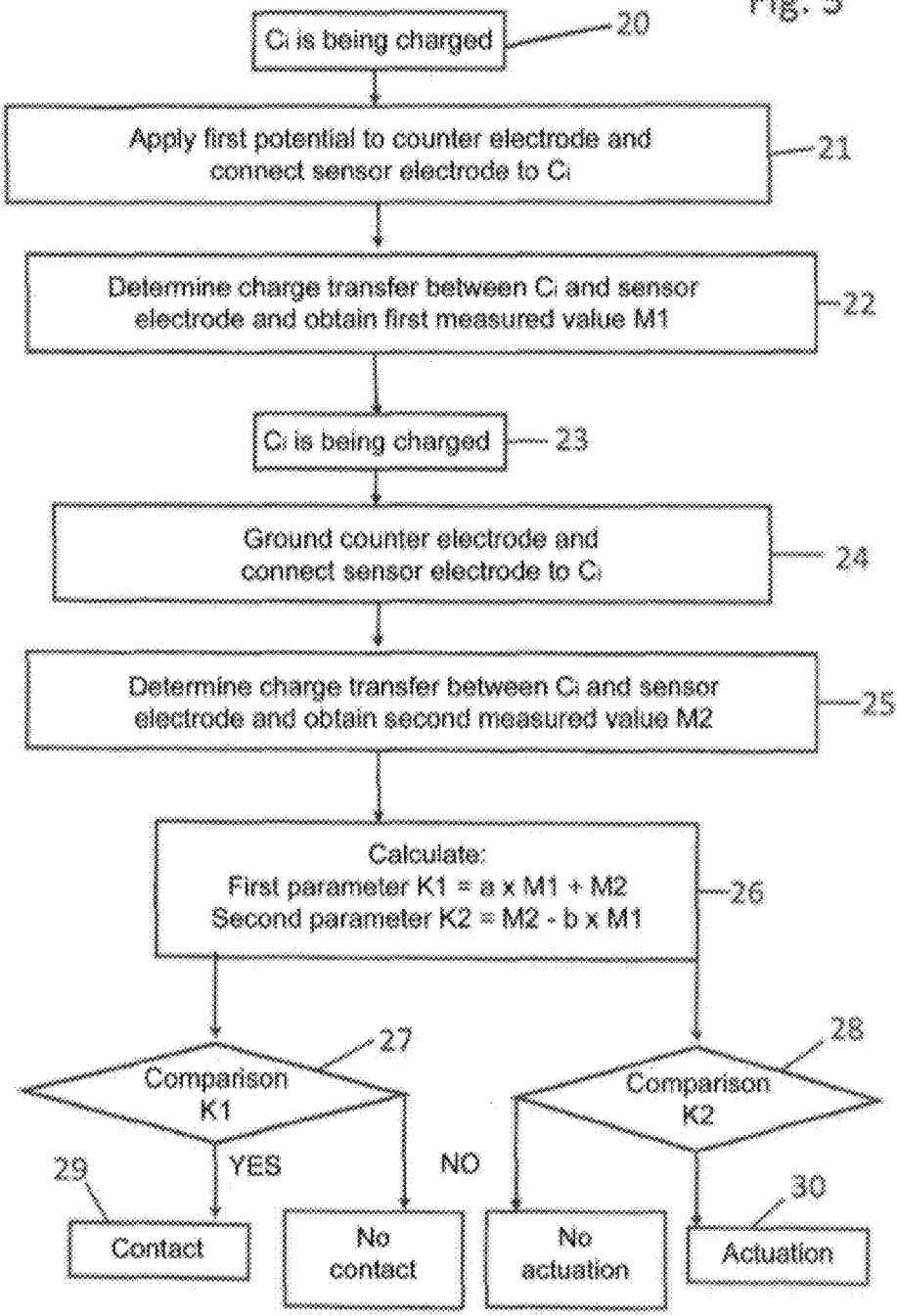

METHOD FOR CAPACITIVELY DETECTING CONTACT AND ACTUATION

CROSS-REFERENCE TO RELATED APPLICATIONS

This application claims priority under 35 U.S.C. § 371 to the International Application No. PCT/EP2018/058156, filed Mar. 29, 2018, and to the German Application No. 10 2017 111 253.7, filed May 23, 2017, the contents of which are hereby incorporated by reference.

TECHNICAL FIELD

The embodiments disclosed herein relate to the field of capacitive contact and actuation detection. An ideal actuation of a contact surface is understood to be the action of an inputting organ, such as a finger of an operator, on the contact surface, which is accompanied by the application of an actuating force, whereas an ideal contact is understood to be the placement of the inputting organ adjacent to the contact surface without any actuating force. In practice, and in the sense of the disclosed embodiments, an action on the contact surface is understood to be a contact if the actuating force applied in the process does not exceed a predefined value, whereas an action on the contact surface is understood to be an actuation if the actuating force applied in the process matches or exceeds a predefined value.

SUMMARY

So far, contact and actuation in the aforementioned sense were detected by different detection devices. In addition to a capacitive contact sensor system, for example, an electromechanical detection device, such as an electro-mechanical button, is provided for contact detection. Furthermore, such devices are known which share similar or identical measuring principles, such as a capacitive measuring principle, for detecting contact and actuation. In addition to a capacitive contact sensor system, for example, a capacitive force sensor is also provided for contact detection. In spite of the consistent measuring principle, these solutions still are disadvantageous in that different electrodes, and in the worst case even independent electronic circuits for evaluation, are used for detection. For actuation detection, for instance, a change of the measuring capacity generated by a pair of electrodes, which is brought about by the actuation, must be detected, whereas for contact detection, at least a change of a measuring capacity generated by another electrode, which is brought about by the contact, must be detected. Disadvantageously, this requires a correspondingly high-performance electronic evaluation system provided with a corresponding number of measurement inputs.

It was found that it is possible, by means of a shrewd capacitive detection method, not only to reduce the design effort for realizing contact and actuation detection, particularly the number of electrodes to be used in the process, but also the requirements with respect to the electronic evaluation system.

Against this background, the object on which the disclosed embodiments are based now lies in providing a method for the capacitive contact and actuation detection which permits a contact and actuation detection that is simplified with regard to its design and/or with respect to the electronic evaluation system. This object is achieved by means of a method according to claim 1. Advantageous embodiments are in each case the subject matter of the dependent claims. An advantageous sensor is the subject matter of claim 10. It must be noted that the features cited individually in the claims can be combined with each other in any technologically meaningful manner and represent other embodiments. The description, in particular in connection with the figures, additionally characterizes and specifies the disclosed embodiments.

The disclosed embodiments relate to a method for the capacitive detection of an actuation and/or a contact of a capacitive sensor by an operator, comprising the following steps. In a step of providing, a capacitive sensor is provided, which defines a contact surface facing towards the operator, and has a counter electrode facing away from the operator and a sensor electrode, which is insulated from the counter electrode, disposed at a distance from the counter electrode across a dielectric, and is brought closer to the counter electrode upon actuation. An electronic evaluation system electrically contacting the sensor electrode and the counter electrode is also provided. Preferably, on the sensor, only exactly one sensor electrode and exactly one counter electrode are provided for each contact surface.

In a first step, a first constant electric potential is applied to the counter electrode of the capacitive sensor for generating a first capacitive measuring field between the sensor electrode and the counter electrode, and in a subsequent measuring step, a first measured value is determined, which is dependent on an induced charge transfer of the sensor electrode caused by the first capacitive measuring field. In a second step, a second constant electric potential differing from the first potential is applied to the counter electrode of the capacitive sensor for generating a second capacitive measuring field between the sensor electrode and the counter electrode, and in a subsequent measuring step, a second measured value is determined, which is dependent on an induced charge transfer of the sensor electrode caused by the second capacitive measuring field.

In a first calculation step subsequent to the first and second steps and the associated measuring steps, a first parameter is calculated from the first and second measured values by means of at least one first mathematical operation. In a second calculation step subsequent to the first and second steps and the associated measuring steps, a second parameter is calculated from the first and second measured values by means of at least one second mathematical operation differing from the first mathematical operation. In subsequent comparison steps, the first parameter and the second parameter are respectively compared with a predefined quantity in order to distinguish a contact from an actuation.

It was found that, using a comparatively simply designed force sensor with two electrodes associated with a contact surface, and by using the aforementioned method, a contact can be distinguished from an actuation in a comparatively simple but nevertheless reliable manner. In this case, a contact is understood to be an action on the contact surface with an actuating force below a predefined value, whereas an actuation is understood to be an action on the contact surface with an actuating force having or exceeding a predefined value.

According to a preferred embodiment, the ground potential is used as the second potential differing from the first potential.

It is preferably provided that the contact surface is arranged so as to be electrically insulated from the sensor electrode. For example, the sensor electrode is applied to a side of an elastically yielding layer of the sensor facing away from the operator.

Preferably, the sensor is formed by a film layer structure. Preferably, the first mathematical operation includes an addition, and the second mathematical operation includes a subtraction. For example, the first and second measured values are added up for determining the first parameter, and the first measured value is subtracted from the second measured value for determining the second parameter. In another embodiment, at least one of the measured values is multiplied by a factor for each calculation of the parameter, wherein the factor may be different for each parameter calculation.

Preferably, the first parameter constitutes a measure for the contact, and the second parameter constitutes a measure for an actuation. In a simple embodiment, the first and second measured values are measured by means of a charging and/or discharging behavior between a measuring capacitor with a predefined capacitance and the sensor electrode. For example, the measuring capacitor is integrated into the electronic evaluation system, and its charging or discharging behavior is detected by the electronic evaluation system, e.g. by means of analog-digital conversion, in order thus to determine the respective charge transfer in or from the measuring capacitor caused by the change of the capacitance between the sensor electrode and the counter electrode due to the actuation-related deformation of the sensor electrode and its approach towards the counter electrode, and/or due to the approach of an operating organ, such as a finger, towards the sensor electrode.

According to another embodiment, an array of capacitive sensors with several sensor electrodes, which are insulated from one another, and a common counter electrode is provided. Thus, the sensor electrodes disposed in the array define an array of contact surfaces, to which, in their entirety, is assigned the common counter electrode. By using a common counter electrode, the number of required measurement inputs of the electronic evaluation system can be reduced as compared to a variant with several counter electrodes. Furthermore, the use of a common counter electrode according to a preferred embodiment of the method makes it possible to identify the contact and/or actuation of several sensors at least by means of, in each case, one of the two respective parameters from the first and the second parameter; thus, the common counter electrode provides the opportunity to be able to detect another contact on another contact surface, or even several contact surfaces, of the force sensor array by means of the respective parameter, e.g. the first parameter.

For example, the several first parameters and/or the several second parameters may be compared to one another in order to detect a primary actuation and one or more secondary actuations. In this case, a primary actuation is understood to be the actuation of the contact surface that is subjected to the largest action of the operating force, whereas a secondary actuation is understood to be an actuation of a contact surface that is not subjected to the largest action of the operating force. In this manner, more complicated user inputs—so-called gestures—can also be realized, which are characterized in that the user simultaneously applies in each case an actuating force to different contact surfaces by several operating organs. Furthermore, the disclosed embodiments relate to the advantageous use of the method in one of the previously described configurations in a motor vehicle.

The disclosed embodiments further relate to a sensor for the capacitive detection of an actuation and/or a contact, which defines a contact surface facing towards the operator, and which has a counter electrode facing away from the operator and a sensor electrode, which is insulated from the counter electrode and disposed at a distance from the counter electrode across a dielectric, wherein the sensor electrode is brought closer to the counter electrode upon actuation. According to an embodiment, an electronic evaluation system is also provided, which is designed to carry out the method in any one of the previously described advantageous embodiments.

BRIEF DESCRIPTION OF THE DRAWINGS

FIG. 3 shows a flow chart illustrating an embodiment of the method.

DETAILED DESCRIPTION

Figure 1:
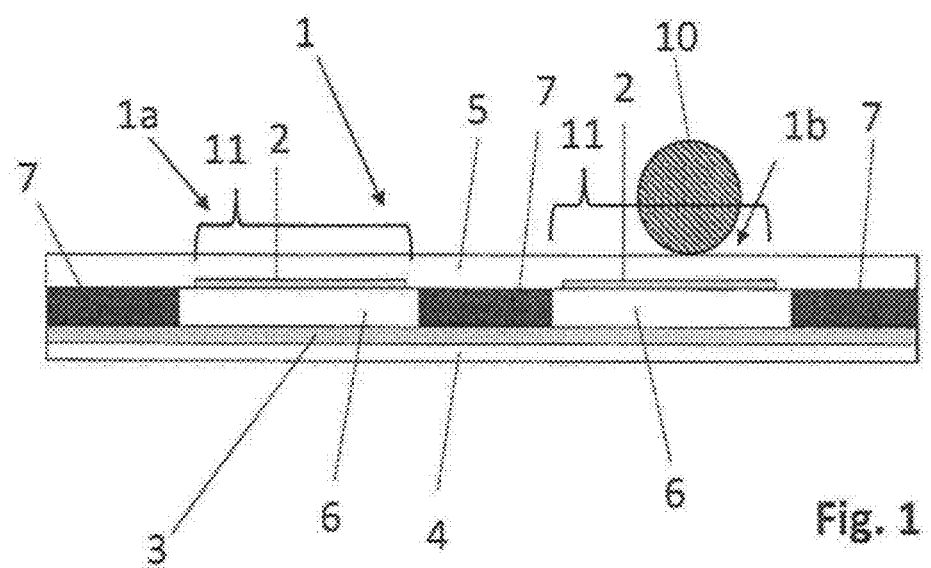
FIG. 1 shows a sectional view of an embodiment of the sensor.

FIG. 1 shows a sectional view through an embodiment of the capacitive sensor $1a$, $1b$ according to an embodiment. The capacitive sensors $1a$, $1b$ form an array 1 of sensors $1a$, $1b$. An actuating surface 11 facing towards the operator is assigned to each of these sensors $1a$, $1b$. The sensors $1a$, $1b$ are formed by a film layer structure comprising a film 4, which faces away from the operator and is to be applied on a substrate, and a film 5 facing towards the operator. The film layer structure further includes a spacer layer 7, which is provided between the films 4 and 5 and forms cavities 6, which are assigned to the actuating surfaces 11 and are completely or partially filled with air or the like as a dielectric. The film 4 facing away from the operator includes a conductive layer defining the counter electrode 3. The counter electrode 3 is disposed adjacent to all cavities 6 of the array of sensors $1a$, $1b$ and thus defines a counter electrode 3 common to, i.e. associated with, all sensors $1a$, $1b$. The film 5 facing towards the operator has several conductive layers, which are respectively associated with one cavity 6 and adjacent to the respective cavity 6, and whose size in space is substantially limited to the cavity 6, and which define, in each case, one sensor electrode 2 assigned to the respective contact surface 11. These sensor electrodes 2 of the sensors $1a$, $1b$ are electrically insulated from one another and are electrically connected to, in each case, one associated electronic evaluation system or an input of a microcontroller associated with the electronic evaluation system. As will be explained later, the sensor electrode 2 serves, among other things, for measuring an actuation on the actuating surface 11.

An actuation causes an elastic deformation of the film 5, which faces towards the operator and defines the respective contact surface 11, and thus causes the film 5 to come closer to the film 4 facing away from the operator, and thus to the counter electrode 3. If a predefined deformation is exceeded, and a predefined actuating force is thus reached, this results in a change of the measuring capacitance, also referred to as CSENSOR, which is generated by the sensor electrode 2 and the counter electrode 3 in the case of a previous application of an electric potential. According to an embodiment, this is detected by the evaluation unit described later, or by the method implemented by the electronic evaluation system, and this detection process is associated with a switching function, if necessary.

The sensor electrode 2 further serves for detecting a contact of the contact surface 11, or possibly even an approach toward it. If an electric potential is applied, the change of the measuring capacitance, also referred to as CUSER, which is generated by the sensor electrode 2 due to an electromagnetic interaction with the operating organ, such as the finger 10 of the user, is to be detected in this case. With regard to the design of the sensors 1a, 1 b, which are characterized by a very simple structure that is very inexpensive to realize, there is the problem that a simultaneous detection of a contact and an actuation is not possible. Furthermore, a mutual electromagnetic influence among the sensors 1a, 1b occurs in an array 1 of sensors 1a, 1 b. Both problems are solved by the method according to an embodiment as it is described in detail below.

Figure 2:
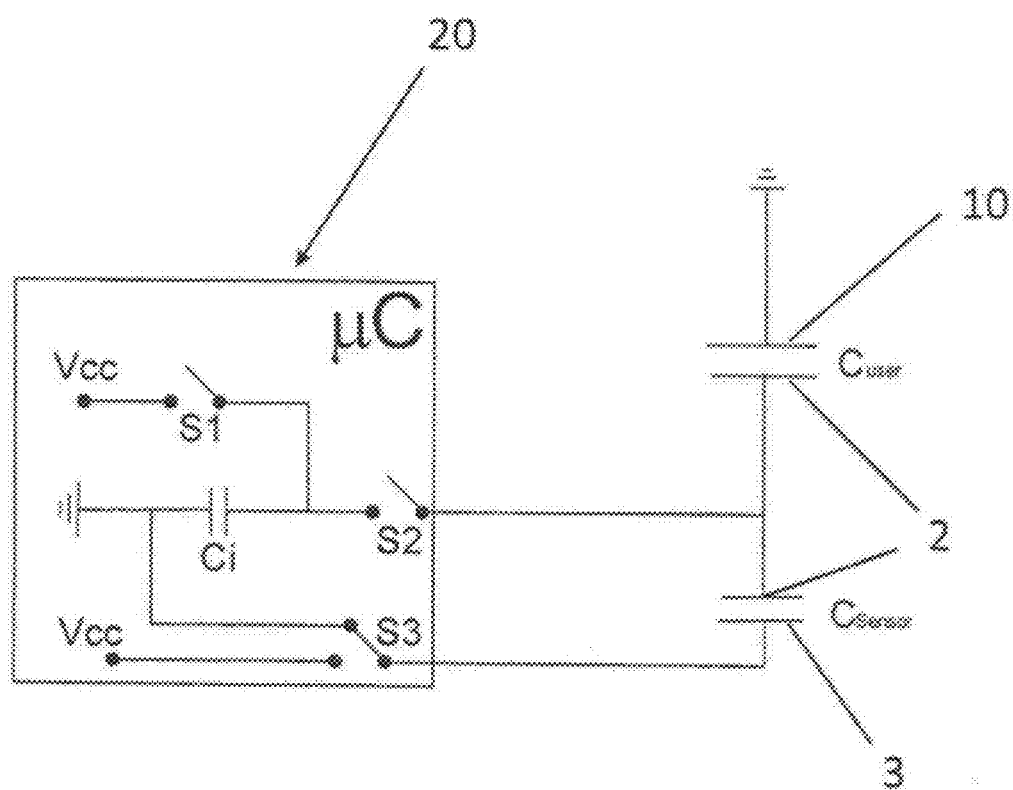
FIG. 2 shows a circuit diagram illustrating an embodiment of the method.

FIG. 2 shows an equivalent circuit diagram, based on which the method according to an embodiment will be explained below. According to an embodiment, an electronic evaluation system 20 in the form of a microcontroller μC is provided, by means of which the method according to an embodiment is realized. This electronic evaluation system 20 includes an internal measuring capacitor Ci with a predefined capacity, whose charging or discharging behavior serves the electronic evaluation system 20 for determining the external capacitances CUSER and CSENSOR in several measuring steps. The different measuring steps and the necessary steps for charging the internal measuring capacitor Ci are realized by a corresponding connection of the electrodes 2, 3, and 10 and the application thereto of the potential VCC or the ground potential. A corresponding connection results from the switching position of the switches S1, S2, and S3. Thus, subsequent to the measuring capacitor Ci being charged, the potential VCC is applied to the counter electrode 3 by means of a corresponding switching position of the switches S1, S2 and S3, and the charge transfer between the sensor electrode 2 and the measuring capacitor Ci is determined in a first measuring step, which thus results in a series connection of the capacitors CUSER and CSENSOR. Subsequent to the measuring capacitor Ci being charged again, the counter electrode 3 is grounded by means of a corresponding switching position of the switches S1, S2, and S3, and the charge transfer between the sensor electrode 2 and the measuring capacitor Ci is determined in a second measuring step, which thus results in a parallel connection of the capacitors CUSER and CSENSOR in the equivalent circuit diagram.

The method according to an embodiment is explained below with reference to the block diagram of FIG. 3. In a first step 20, the internal measuring capacitor Ci is charged by means of the potential VCC. In a subsequent step 21, the first potential VCC is applied to the counter electrode 3 and the sensor electrode 2 is connected to the internal measuring capacitor Ci. In a subsequent measuring step 22, the charge transfer between Ci and the sensor electrode 2 is determined and a measured value M1 proportional to the charge transfer is obtained. In a subsequent step 23, the internal measuring capacitor Ci is again charged by means of the potential VCC. In a subsequent step 24, the counter electrode 3 is connected to ground potential as a second potential, i.e. grounded, and the sensor electrode 2 is connected to the internal measuring capacitor Ci.

In a subsequent measuring step 25, the charge transfer between Ci and the sensor electrode 2 is determined and a measured value M2 proportional to this charge transfer is obtained. It is not obligatory that the determination of the measured values M1 and M2 take place in the above-described sequence in time; rather, a determination in the reverse order is also to be considered to be inventive. In a subsequent step 26, the first parameter K1 is formed from the sum of the measured value M1, multiplied by a factor a, and the second measured value M2. The second parameter K2 is formed by the subtraction of the first measured value M1, multiplied by a factor b, from the second measured value M2. For example, the factors a and b are fixed quantities and are preferably 1; for example, they are in the range of 0.5 to 1.5. In subsequent comparison steps 27 and 28, the parameters K1 and K2 are respectively compared with predefined values, and if the values match correspondingly or if the value comes close to the predefined value, a contact is positively detected in step 29, or an actuation in step 30, wherein the parameter K1 obtained from the addition of the measured values M1 and M2 is suitable for detecting the contact, and the parameter K2 obtained from the subtraction of the measured values M1 and M2 is suitable for detecting an actuation. A change of the switching state, which is caused by the electronic evaluation system, is in each case associated with a positive detection in, for example, step 29 and step 30.

The invention claimed is:

1. A method for the capacitive detection of at least a contact of a capacitive sensor by an operator, comprising:
providing the capacitive sensor, which defines a contact surface facing towards the operator, and has a counter electrode facing away from the operator and a sensor electrode, which is disposed at a distance across a dielectric, is insulated from the counter electrode and is brought closer to the counter electrode when the contact surface is actuated, and providing an electronic evaluation system electrically contacting the sensor electrode and the counter electrode;
applying a first constant electric potential to the counter electrode of the capacitive sensor for generating a first capacitive measuring field between the sensor electrode and the counter electrode, and then determining a first measured value, which is dependent on an induced charge transfer of the sensor electrode caused by the first capacitive measuring field;
applying a second constant electric potential, which differs from the first potential, to the counter electrode of the capacitive sensor for generating a second capacitive measuring field between the sensor electrode and the counter electrode, and then determining a second measured value, which is dependent on an induced charge transfer of the sensor electrode caused by the second capacitive measuring field;
calculating a first parameter from the first measured value and the second measured value by means of at least one first mathematical operation, wherein the first mathematical operation is a sum of the first measured value multiplied by a first fixed factor value and the second measured value;
calculating a second parameter from the first measured value and the second measured value by means of at least one second mathematical operation differing from the first mathematical operation, wherein the second mathematical operation is a substruction of the second measured value by the first measured value multiplied by a second fixed factor value; and
respectively comparing the first parameter and the second parameter with a predefined quantity in order to distinguish a contact from an actuation.

2. The method according to claim 1, wherein the second potential is ground potential.

3. The method according to claim 1, wherein the contact surface is electrically insulated from the sensor electrode.

4. The method according to claim 1, wherein the first mathematical operation includes an addition, and the second mathematical operation includes a subtraction.

5. The method according to claim 4, wherein the first parameter constitutes a measure for the contact and the second parameter constitutes a measure for an actuation.

6. The method according to claim 1, wherein the first measured value and the second measured value are measured by means of a charging and/or discharging behavior between a measuring capacitor with a predefined capacitance and the sensor electrode.

7. A method according to claim 1, wherein an array of capacitive sensors with several sensor electrodes, which are insulated from one another, and associated contact surfaces and a common counter electrode is provided.

8. The method according to claim 7, wherein the at least contact of several sensors is identified at least by means of one of the two parameters, respectively, from the first parameter and the second parameter.

9. The method according to claim 7, wherein any of: a primary actuation and a gesture is detected by comparing several first parameters and/or second parameters.

10. A sensor for the capacitive detection of at least a contact, which defines a contact surface facing towards the operator, and has a counter electrode facing away from the operator and a sensor electrode, which is insulated from the counter electrode, is disposed at a distance from the counter electrode across a dielectric, and is brought closer to the counter electrode when the contact surface is actuated, and includes an electronic evaluation system designed to carry out the method according to claim 1.

* * * * *